United States Patent
Lee et al.

(10) Patent No.: US 8,912,068 B2
(45) Date of Patent: Dec. 16, 2014

(54) SEMICONDUCTOR DEVICE WITH STRAINED CHANNEL AND METHOD OF FABRICATING THE SAME

(75) Inventors: Young-Ho Lee, Icheon-si (KR); Seung-Joon Jeon, Icheon-si (KR); Tae-Hang Ahn, Icheon-si (KR)

(73) Assignee: Hynix Semiconductor Inc., Icheon-Si, Gyeonggi-Do (KR)

( * ) Notice: Subject to any disclaimer, the term of this patent is extended or adjusted under 35 U.S.C. 154(b) by 138 days.

(21) Appl. No.: 13/560,577

(22) Filed: Jul. 27, 2012

(65) Prior Publication Data

US 2012/0302024 A1  Nov. 29, 2012

Related U.S. Application Data

(62) Division of application No. 12/343,347, filed on Dec. 23, 2008, now Pat. No. 8,253,204.

(30) Foreign Application Priority Data

Apr. 18, 2008 (KR) .................. 10-2008-0036010

(51) Int. Cl.
- *H01L 21/336* (2006.01)
- *H01L 29/78* (2006.01)
- *H01L 29/66* (2006.01)
- *H01L 29/165* (2006.01)
- *H01L 29/08* (2006.01)

(52) U.S. Cl.
CPC ........ *H01L 29/7848* (2013.01); *H01L 29/7834* (2013.01); *H01L 29/66636* (2013.01); *H01L 29/165* (2013.01); *H01L 29/0847* (2013.01)
USPC ........................... 438/285; 438/222; 438/226

(58) Field of Classification Search
USPC .................. 438/222, 226; 257/E21.431
See application file for complete search history.

(56) References Cited

U.S. PATENT DOCUMENTS

| | | | |
|---|---|---|---|
| 7,060,579 B2 * | 6/2006 | Chidambaram et al. | 438/303 |
| 7,413,957 B2 * | 8/2008 | Nouri et al. | 438/300 |
| 2005/0148142 A1 * | 7/2005 | Cabral et al. | 438/280 |
| 2006/0011984 A1 * | 1/2006 | Currie | 257/352 |
| 2006/0076627 A1 * | 4/2006 | Chen et al. | 257/369 |
| 2006/0131665 A1 * | 6/2006 | Murthy et al. | 257/384 |

(Continued)

FOREIGN PATENT DOCUMENTS

| | | |
|---|---|---|
| KR | 1020070096507 | 10/2007 |
| KR | 1020070100787 | 10/2007 |
| KR | 1020080098894 | 11/2008 |

OTHER PUBLICATIONS

Chang et al.; "Strained Si channel NMOSFETs using a stress field with Si1-yCy source and drain stressors"; Elsevier; Thin Solid Films; 2006; pp. 333-337.

(Continued)

*Primary Examiner* — Long K Tran
*Assistant Examiner* — Jordan Klein
(74) *Attorney, Agent, or Firm* — Lowe Hauptman & Ham, LLP

(57) ABSTRACT

A semiconductor device includes: a gate pattern over a substrate; recess patterns provided in the substrate at both sides of the gate pattern, each having a side surface extending below the gate pattern; and a source and a drain filling the recess patterns, and forming a strained channel under the gate pattern.

13 Claims, 7 Drawing Sheets

(56) References Cited

U.S. PATENT DOCUMENTS

| | | | |
|---|---|---|---|
| 2007/0004123 A1* | 1/2007 | Bohr et al. | 438/230 |
| 2007/0190731 A1* | 8/2007 | Chen et al. | 438/299 |
| 2008/0230840 A1* | 9/2008 | Chen et al. | 257/368 |
| 2008/0233687 A1* | 9/2008 | Chen et al. | 438/151 |
| 2009/0032880 A1* | 2/2009 | Kawaguchi et al. | 257/369 |
| 2009/0189203 A1* | 7/2009 | Matsuo | 257/288 |

OTHER PUBLICATIONS

Korean Office ActionPatent Application No. 10-2008-0036010.

Korean Notice of Allowance for 10-2008-0036010.

* cited by examiner

PRIMARY ETCH (ANISOTROPIC ETCH)

SEMICONDUCTOR DEVICE WITH STRAINED CHANNEL AND METHOD OF FABRICATING THE SAME

CROSS-REFERENCE TO RELATED APPLICATIONS

The present application is a Divisional of patent application Ser. No. 12/343,347, filed on Dec. 23, 2008, which claims priority from Korean patent application number 10-2008-0036010, filed on Apr. 18, 2008, and the disclosure of which is hereby incorporated by reference herein its entirety.

BACKGROUND

The disclosure relates to a method for fabricating a semiconductor device, and more particularly, to a semiconductor device with a strained channel and a method for fabricating the same.

As the integration of semiconductor devices continues to increase, the channel lengths of metal oxide semiconductor (MOS) devices continue to be reduced. The reduction in a channel length increases carrier mobility, i.e., hole or electron mobility, and thus an operation speed and operation current of a semiconductor device also increases.

However, the reduction in a channel length brings about a short channel effect (SCE) such as a decrease in a threshold voltage. If an impurity doping concentration increases to overcome the short channel effect, an impurity scattering of carriers into a channel or channels also increases, resulting in a decrease in carrier mobility. Accordingly, the operation speed and operation current of a device is reduced.

Therefore, various methods of increasing carrier mobility by inducing a strain in the channels has been proposed to improve the operation speed and operation current of a semiconductor device. Among these methods, much attention has been paid to a method of forming a strained channel, which includes forming a recess pattern in a region for a source and a drain around sidewalls of a gate pattern, filling the recess pattern with an epitaxial layer formed of a Group IV element having different lattice constant from that of silicon, and applying a stress to the channel.

FIG. 1 illustrates a cross-sectional view of a typical semiconductor device with a strained channel.

Referring to FIG. 1, a gate pattern 13 is formed on a silicon substrate 11, and gate spacers 14 are formed on both sidewalls of the gate pattern 13. At both sides of the gate pattern 13, recess patterns 12 are provided in the silicon substrate 11 where a source S and a drain D will be formed. Epitaxial layers 15 are formed to fill the recess patterns 12 through selective epitaxial growth (SEG). A strained channel C is formed in the silicon substrate 11 between the recess patterns 12. The epitaxial layers 15 are formed of a material having a different lattice constant from that of the silicon substrate 11, and serve as the source S and the drain D. For example, the epitaxial layer 15 is an epitaxial silicon germanium (SiGe) layer or an epitaxial silicon carbon (SiC) layer.

To effectively induce a strain in the channel C in the typical semiconductor device, a method of increasing a volume of the epitaxial layer 15 by increasing a depth of the recess pattern 12, or a method of increasing a difference in lattice constant between the silicon substrate 11 and the epitaxial layer 15 by increasing the concentration of germanium or carbon in the epitaxial layer 15, is employed.

However, the increase in the depth of the recess pattern causes a growth thickness of the epitaxial layer 15 to be increased, leading to a reduction in productivity of devices. Furthermore, due to a critical thickness of the epitaxial layer 15 allowing the epitaxial layer 15 to grow without a defect through the SEG, the layer quality of the epitaxial layer 15 is reduced as the growth thickness of the epitaxial layer 15 is increased.

Moreover, if the concentration of germanium or carbon in the epitaxial layer 15 increases, the critical thickness allowing the epitaxial layer 15 to grow without a defect through the SEG is reduced and therefore reduces the quality of the layer.

SUMMARY

Embodiments are directed to providing a semiconductor device with a strained channel and a method for fabricating the same, which can increase a volume of an epitaxial layer serving as a source and a drain without an increase in a depth of a recess pattern.

Embodiments are also directed to provide a semiconductor device with a strained channel and a method for fabricating the same, which can induce a strain in the channel effectively without an increase in a concentration of germanium or carbon in an epitaxial layer serving as a source and a drain.

In accordance with one embodiment, there is provided a semiconductor device, which includes: a gate pattern over a substrate; recess patterns provided in the substrate at both sides of the gate pattern, each having a side surface extending below the gate pattern; and a source and a drain filling the recess patterns, and forming a strained channel under the gate pattern. The semiconductor device may further include protection layers disposed between the substrate and the source, and between the substrate and the drain.

The substrate may include a silicon substrate, and the source and the drain comprise a material having a lattice constant differing from that of the substrate.

The source and the drain may include an epitaxial layer formed by a selective epitaxial growth (SEG). The source and the drain may include one layer selected from the group consisting of an epitaxial silicon germanium (SiGe) layer, an epitaxial silicon carbon (SiC) layer, and an epitaxial silicon germanium carbon (SiGeC) layer. The concentration of germanium in the epitaxial silicon germanium layer may range from approximately 5% to approximately 50%. The concentration of carbon in the epitaxial silicon carbon layer may range from approximately 0.1% to approximately 10%. The source and the drain may include an epitaxial layer doped with p-type or n-type dopant.

The protection layer may include a material having a lattice constant equal to that of the substrate. The protection layer may include an epitaxial layer formed through an SEG. The protection layer may include an epitaxial silicon layer.

In accordance with another embodiment, there is provided a method for fabricating a semiconductor device, the method including: forming a gate pattern over a substrate; etching the substrate at both sides of the gate pattern to form recess patterns each having a side surface extending below the gate pattern; and forming a source and a drain filling the recess patterns through an epitaxial growth. The method may further include a protection layer over a surface of the recess pattern through an epitaxial growth before forming the source and the drain.

The substrate may include a silicon substrate, and the source and the drain comprise a material having a lattice constant differing from that of the substrate.

The formation of the recess patterns may include: forming first gate spacers over both sidewalls of the gate pattern; performing a primary etch on the substrate to a predetermined etch depth using the gate pattern and the first gate spacers as an etch barrier through an anisotropic etch; forming second gate spacers over both of the sidewalls of the gate pattern and sidewalls of the substrate exposed during the primary etch; and performing a secondary etch on the substrate using the gate pattern and the second gate spacer as an etch barrier through an isotropic etch. The predetermined depth of the primary etch may range from approximately 20% to approximately 50% with respect to a total depth of the recess pattern.

The source and the drain may include an epitaxial layer growing through an SEG. The source and the drain may include one selected from the group consisting of an epitaxial silicon germanium (SiGe) layer, an epitaxial silicon carbon (SiC) layer, and an epitaxial silicon germanium carbon (SiGeC) layer. The concentration of germanium in the epitaxial silicon germanium layer may range from approximately 5% to approximately 50%. The concentration of carbon in the epitaxial silicon carbon layer may range of approximately 0.1% to approximately 10%. The source and the drain may include an epitaxial layer doped with p-type or n-type dopant.

The protection layer may include a material having a lattice constant equal to that of the substrate. The protection layer may include an epitaxial layer formed through an SEG. The protection layer may include an epitaxial silicon layer. The source and drain, and the protection layer may be formed in-situ.

BRIEF DESCRIPTION OF THE DRAWINGS

Various embodiments are illustrated by way of example, and not by limitation, in the figures of the accompanying drawings.

DESCRIPTION OF EMBODIMENTS

Other objects and advantages can be understood by the following description, and become apparent with reference to the embodiments.

In the figures, the dimensions of the layers and regions are exaggerated for clarity of illustration. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The embodiments to be described below relate to a semiconductor device with a strained channel and a method for fabricating the same, which can improve an operation current and operation speed of the semiconductor device by enhancing carrier mobility in virtue of a strain applied to the channel.

Figure 1:
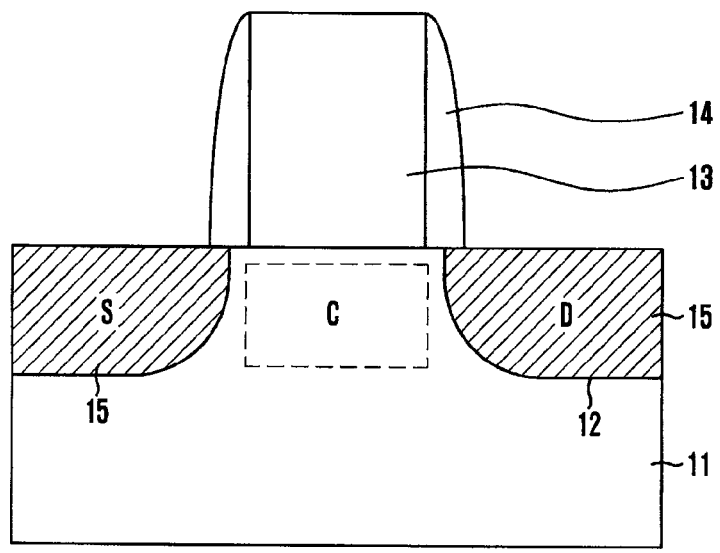
FIG. 1 illustrates a cross-sectional view of a typical semiconductor device with a strained channel.
Figure 2:
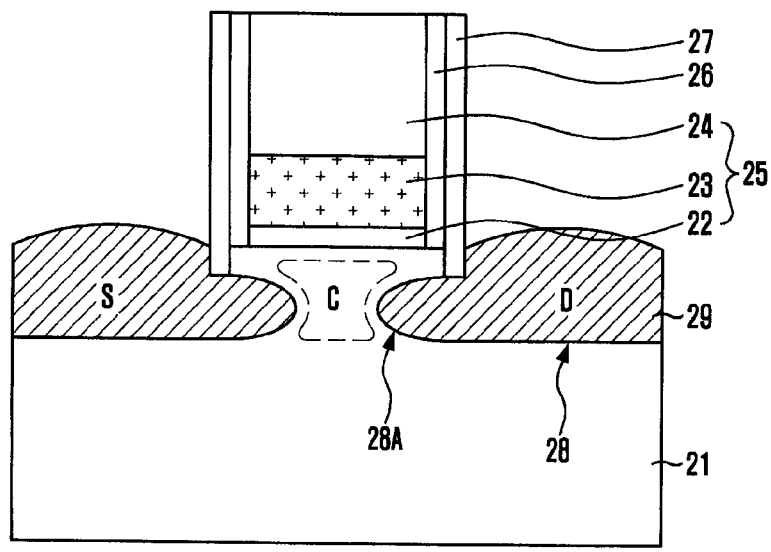
FIG. 2 illustrates a semiconductor device with a strained channel in accordance with one embodiment.

FIG. 2 illustrates a semiconductor device with a strained channel in accordance with an embodiment.

Referring to FIG. 2, the semiconductor device includes a gate pattern 25 disposed on a substrate 21, recess patterns 28, a source S, and a drain D. The recess patterns 28 are provided in the substrate 21 at both sides of the gate pattern 25. Each of the recess patterns 28 has a side surface or extension 28A extending below the gate pattern 25. The source S and the drain D fill the recess pattern 28, and a strained channel C is provided under the gate pattern 25. The semiconductor device may further include first gate spacers 26 on both sidewalls of the gate pattern 25, and second gate spacers 27 on the first gate spacers 26. Here, one end of the second gate spacer 27 extends to the side surface 28A of the recess pattern 28. The substrate 21 may be a silicon substrate.

The source S and the drain D may comprise an epitaxial layer 29 that is formed of a material having a different lattice constant from that of the silicon substrate, and formed through an epitaxial growth, for example, a selective epitaxial growth (SEG). The epitaxial layer 29 includes an epitaxial silicon layer. The epitaxial silicon layer 29 may contain at least one of germanium (Ge) and carbon (C). For example, the epitaxial layer 29 may be one selected from the group consisting of an epitaxial silicon germanium (SiGe) layer, an epitaxial silicon carbon (SiC) layer, and an epitaxial silicon germanium carbon (SiGeC) layer.

The amount of stress applied to the channel C can be adjusted depending on the concentration of germanium or carbon contained in the epitaxial layer 29. This is because a difference in lattice constant between the substrate 21 and the epitaxial layer 29 increases as the concentration of germanium or carbon contained in the epitaxial layer 29 increases. As the difference in lattice constant between the substrate 21 and the epitaxial layer 29 increases, the amount of stress applied to the channel C also increases so that the strained channel C can be effectively formed. However, the concentration and the layer quality establish a trade-off relationship. That is, as the concentration of germanium or carbon contained in the epitaxial layer 29 increases, the layer quality of the epitaxial layer 29 decreases. Therefore, the concentration of germanium contained in the epitaxial silicon germanium layer may be in the range of approximately 5% to approximately 50%, and the concentration of carbon contained in the epitaxial silicon carbon layer may be in the range of approximately 0.1% to approximately 10%.

The electrical properties of a semiconductor device can be controlled depending on the kinds of germanium or carbon is contained in the epitaxial layer 29. To be specific, the epitaxial layer 29 may be formed of an epitaxial SiGe layer in a PMOS. This is because the epitaxial SiGe layer applies a compressive stress to the channel C to increase hole mobility. In contrast, the epitaxial layer 29 is formed of an epitaxial SiC layer in an NMOS because the epitaxial SiC layer applies a tensile stress to the channel C to increase electron mobility.

Furthermore, the epitaxial layer 29 may include dopant to adjust conductivity in that the epitaxial layer 29 serves as the source S and the drain D. The kind of dopant, doping concentration, and doping method can be determined and controlled according to the characteristics of the device. More specifically, a PMOS may use p-type dopant such as boron (B), and an NMOS may use n-type dopant such as phosphor (P) or arsenide (As). The doping concentration may be in the range of approximately $1\times10^{16}$ atoms/cm$^3$ to approximately $1\times10^{21}$ atoms/cm$^3$. The doping process is performed in-situ during the formation of the epitaxial layer 29, or may be performed using ion implantation after the epitaxial layer 29 grows.

The gate pattern 25 may include a gate dielectric layer 22, a gate electrode 23, and a gate hard mask layer 24. The gate dielectric layer 22 may include an oxide, e.g., silicon oxide ($SiO_2$) layer. The gate electrode 23 may include one layer selected from the group consisting of a polysilicon layer, a metal layer, a conductive metal nitride layer, a conductive metal oxide layer, and a metal silicide layer, or a multilayer thereof. The metal layer may include tungsten (W), nickel (Ni) or titanium (Ti). The conductive metal nitride layer may include a titanium nitride (TiN) layer. The conductive metal oxide layer may include an iridium oxide ($IrO_2$) layer. The metal silicide layer may include a titanium silicide (TiSi) layer. The gate hard mask layer 24 may include a monolayer selected from the group consisting of an oxide layer, a nitride layer, an oxynitride layer, and an amorphous carbon layer, or a multilayer thereof. The oxide layer may include boron phosphorus silicate glass (BPSG), phosphorus silicate glass (PSG), tetra ethyl ortho silicate (TEOS), undoped silicate glass (USG), spin-on glass (SOG), high-density plasma (HDP) or spin-on dielectric (SOD). The nitride layer may include a silicon nitride ($Si_3N_4$) layer. The oxynitride layer may include a silicon oxynitride (SiON) layer.

As described above, the semiconductor device in accordance with one or more embodiments includes the recess pattern 28 of which the side surface 28A extends below the gate pattern 25, which makes it possible to increase a volume of the epitaxial layer 29 without an increase in a depth of the recess pattern 28. That is, the volume of the epitaxial layer 29 can be increased without increasing the growth thickness of the epitaxial layer 29.

The increase in the volume of the epitaxial layer 29 can effectively induce a strain in the channel C, thus improving electrical properties of the semiconductor device with the strained channel. Furthermore, the concentration of germanium or carbon contained in the epitaxial layer 29 can be reduced by increasing the volume of the epitaxial layer 29. This allows the layer quality of the epitaxial layer 29 to be improved.

In addition, the growth thickness of the epitaxial layer 29 is not increased, so that the defect-free epitaxial layer, i.e., the epitaxial layer 29 with excellent layer quality can be obtained and the productivity of the epitaxial layer 29 can be improved as well.

Consequently, in accordance with one or more embodiments, it is possible to improve device characteristics by increasing an operation speed and operation current of the semiconductor device with the strained channel.

FIGS. 3A to 3E illustrate a method for fabricating the semiconductor device with a strained channel in accordance with the embodiment.

Figure 3A:
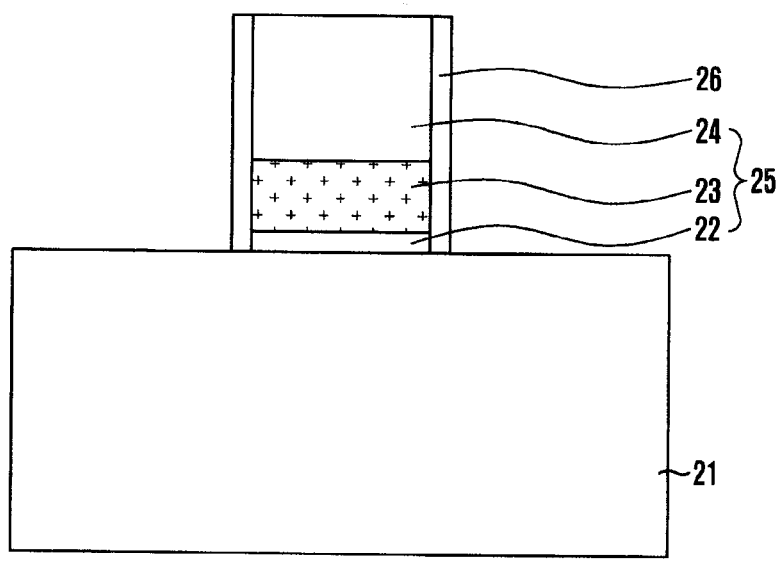
FIGS. 3A to 3E illustrate a method for fabricating the semiconductor device with a strained channel in accordance with the embodiment.

Referring to FIG. 3A, a gate pattern 25 is formed on a substrate 21. Here, although not shown, a device isolation structure is formed to isolate devices before the formation of the gate pattern 25.

The gate pattern 25 may be formed to have a stacked structure where a gate dielectric layer 22, a gate electrode 23, and a gate hard mask layer 24 are stacked in sequence. The gate dielectric layer 22 may include an oxide layer, e.g., a silicon oxide ($SiO_2$) layer, and the silicon oxide layer may be formed using thermal oxidation process. The gate electrode 23 may include a monolayer selected from the group consisting of a polysilicon layer, a metal layer, a conductive metal nitride layer, a conductive metal oxide layer, and a metal silicide layer, or a multilayer thereof. The gate hard mask layer 24 may include a monolayer selected from the group consisting of an oxide layer, a nitride layer, an oxynitride layer, and an amorphous carbon layer, or a multilayer thereof. The substrate 21 may include a silicon substrate.

First gate spacers 26 are formed on both sidewalls of the gate pattern 25. The first gate spacer 26 may include a monolayer or a multilayer of oxide and/or nitride. The oxide layer may be a silicon oxide layer ($SiO_2$), and the nitride layer may be a silicon nitride ($Si_3N_4$) layer.

Here, the first gate spacers 26 may be formed in various ways. For example, a nitride layer can be formed over the substrate 21 including the gate pattern 25, and a blanket etch then performed to form the first gate spacers 26. The blanket etch may be performed using an etch-back process.

Figure 3B:
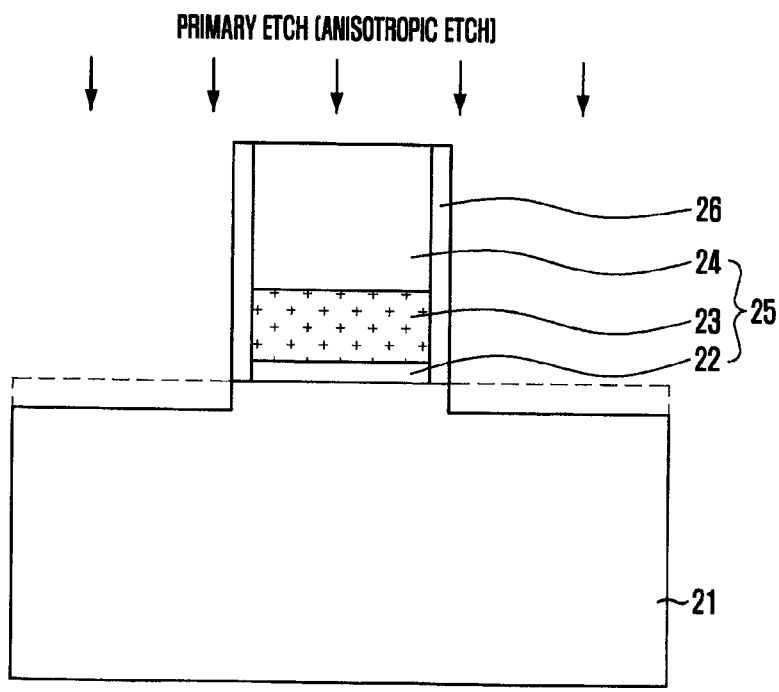

Referring to FIG. 3B, the substrate 21 is etched to a predetermined depth using the gate pattern 25 and the first gate spacer 26 as an etch barrier, which will be referred to as a 'primary etch' for simplicity. The primary etch, which is a process of forming a recess pattern of which a side surface extends below the gate pattern 25, may be controlled such that an etch depth is in the range of approximately 20% to approximately 50% with respect to a total depth of a recess pattern to be formed later.

Here, the primary etch may be performed anisotropically. Therefore, the primary etch may be performed using an anisotropic dry etch. The anisotropic dry etch may be performed ex-situ or in-situ. For reference, the meaning of anisotropic dry etch performed ex-situ, is that the etching process of forming the first gate spacer 26 and the primary etch are performed in different chambers, respectively, or performed in the same chamber discontinuously. The meaning of anisotropic dry etch performed in-situ, is that the etching process of forming the first gate spacer 26 and the primary etch are performed in the same chamber continuously.

To be specific, the primary etch using the anisotropic dry etch may be performed using plasma including a gas containing fluorine (F) and carbon (C) and a gas mixture of oxygen ($O_2$) gas and argon (Ar) gas. The gas containing fluorine (F) and carbon (C) may include fluorocarbon ($C_xF_y$) gas, where x and y are natural numbers, or fluoromethane ($C_xH_yF_z$), where x, y and z are natural numbers. The fluorocarbon gas may include $CF_4$, $C_2F_6$, etc., and the fluoromethane gas may include $CHF_3$, $CH_2F_2$, etc. For example, the primary etch may be performed using a plasma of a gas mixture of $CF_4$/$O_2$/Ar, or a plasma of a gas mixture of $CHF_3$/$O_2$/Ar.

Figure 3C:
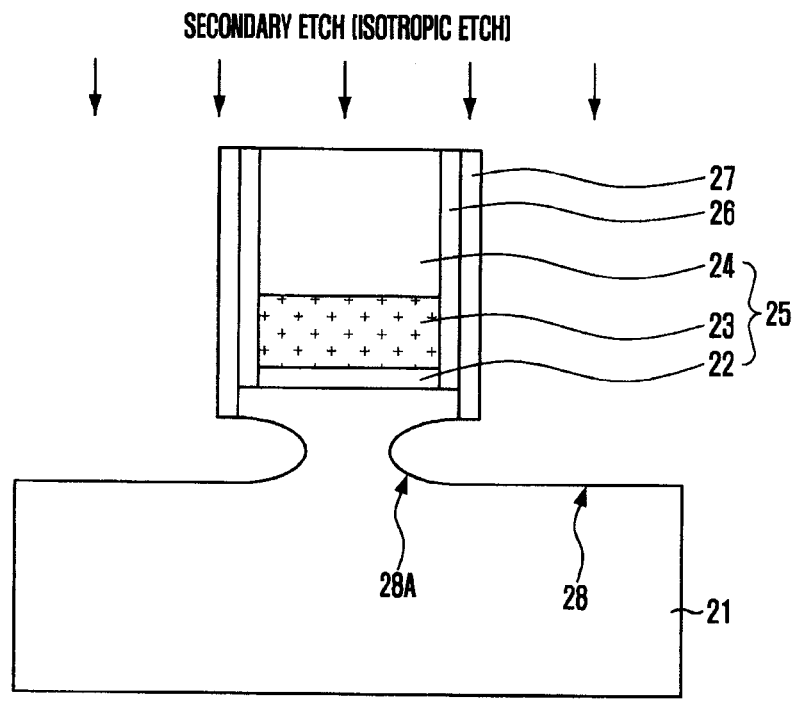

Referring to FIG. 3C, an insulation layer for a gate spacer is formed over the substrate 21 including the first gate spacers 26, and a blanket etch, e.g., etch-back process is then performed to form second gate spacers 27 on both sidewalls of the gate pattern 25 including the first gate spacers 26. Resultantly, the second gate spacers 27 are formed to cover the both sidewalls of the gate pattern 25 and the both sidewalls of a portion of the substrate 21 protruding upward during the primary etch.

Here, the second gate spacer 27 may include a monolayer or a multilayer of oxide and/or nitride. A thickness of the second gate spacer 27 can be adjusted in consideration of a subsequent process of forming a recess pattern.

The substrate 21 is etched using the gate pattern 25 and the second gate spacers 27 as an etch barrier to thereby form recess patterns 28 of which side surfaces 28A extend below the gate pattern 25. Hereinafter, this etching process will be referred to as a 'secondary etch'. The recess patterns 28 are regions where a source and a drain will be formed during a subsequent process.

The secondary etch for forming the recess pattern 28 of which the side surface 28A extends below the gate pattern 25, may be performed such that the substrate 21 is etched to an etch depth ranging from approximately 100 Å to approximately 1,000 Å in a vertical direction, and also etched sufficiently in a horizontal (lateral) direction considering a thickness of the first gate spacer 26, a thickness of the second gate spacer 27, a channel length, and a height of the gate pattern 25.

Further, the secondary etch may be performed isotropically to extend the side surface 28A of the recess pattern 28 below the gate pattern 25. Therefore, the secondary etch may be performed using an isotropic dry etch or isotropic wet etch. The isotropic dry etch may be performed ex-situ or in-situ.

For example, when the secondary etch is performed using the isotropic dry etch, the secondary etch may be performed using a plasma of a gas mixture containing HBr, $Cl_2$, and $SF_6$. As it is well known, a silicon layer (or silicon substrate) is popularly used for isotropic etch because silicon exhibits excellent reactivity with HBr, $Cl_2$, and $SF_6$. Here, since the secondary etch is an isotropic etch, the substrate 21 is etched only in a vertical direction due to the second gate spacer 27 at an initial etching stage. However, as the secondary etch is further performed to expose the substrate 21 uncovered with the secondary gate spacer 27, the substrate 21 begins to be etched in a horizontal direction. Resultantly, it is possible to form the recess pattern 28 having the side surface 28A of which an etch profile has the shape of '⊂' or '<', as illustrated in FIG. 3C.

Meanwhile, etch by-products may be produced during the secondary etch, and remain on the surface of the recess pattern 28. The etch by-products remaining on the surface of the recess pattern 28 may cause defects to be generated in an epitaxial layer during a subsequent epitaxial growth, or the adhesion between the epitaxial layer and the substrate 21 becomes poor so that the epitaxial layer may not grow well.

When the secondary etch is performed using plasma, the surface of the recess pattern 28 may be damaged by plasma, which causes defects to be generated on the surface of the recess pattern 28. The defects on the surface of the recess pattern 28 propagate into the epitaxial layer during an epitaxial growth to be performed later, and resultantly the layer quality of an epitaxial layer may be deteriorated.

Figure 3D:
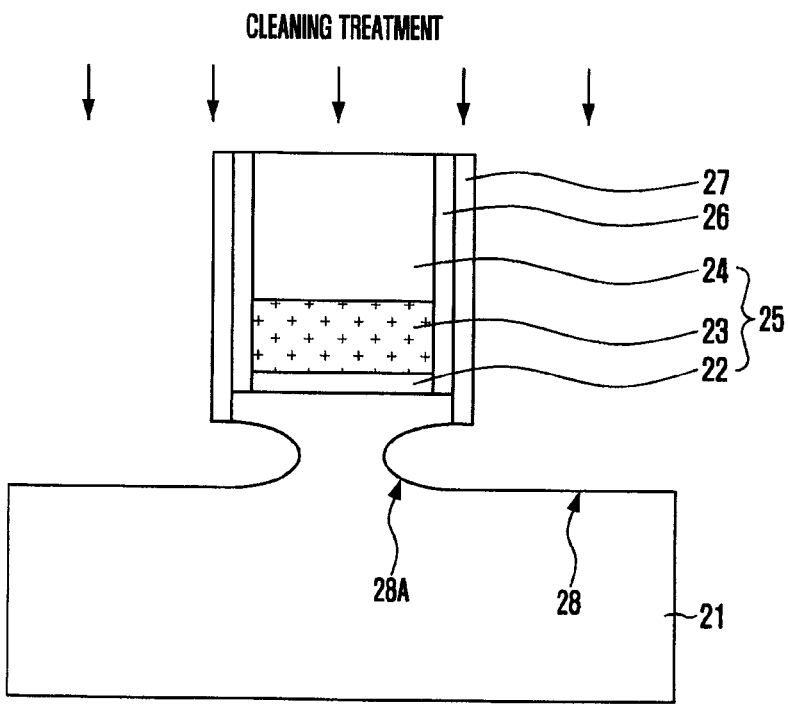

Therefore, referring to FIG. 3D, a cleaning treatment is performed on the surface of the recess pattern 28 to remove residues, e.g., etch by-products remaining on the surface of the recess pattern 28, and also to cure surface damage of the recess pattern 28. The cleaning treatment may be performed using either a wet cleaning or dry cleaning or both of wet cleaning and dry cleaning. More specifically, the dry cleaning may be performed using a gas mixture of $CF_4$ and $O_2$, and the wet cleaning may be performed using a mixed solution of sulfuric acid ($H_2SO_4$) and hydrogen peroxide ($H_2O_2$) or using a buffered oxide etchant (BOE) which is a mixed solution of $NH_4F$ and HF.

Also, the cleaning treatment may be performed in-situ in an apparatus of forming an epitaxial layer. The cleaning treatment may be performed using a gas or solution having good etch selectivity allowing damage to the first and second gate spacers 26 and 27 to be minimized. Furthermore, the cleaning treatment may be performed at a relatively low temperature, e.g., in the range of a room temperature to approximately 600° C.

In this way, it is possible to prevent defects from being generated in an epitaxial layer to be formed later, by removing residues such as a natural oxide and an etch by-product remaining on the surface of the recess pattern, and simultaneously curing the surface damage of the recess pattern through the cleaning treatment.

Figure 3E:
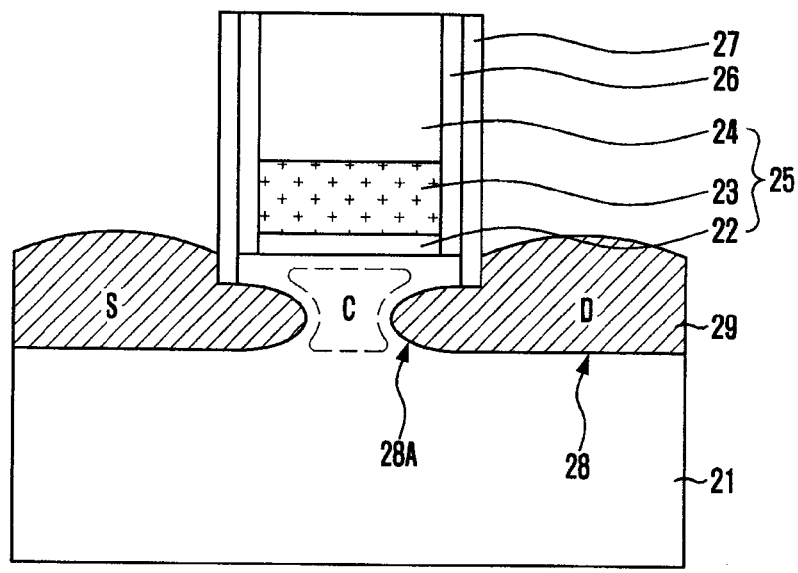

Referring to FIG. 3E, epitaxial layers 29 are formed in the recess patterns 28 using an epitaxial growing apparatus. The epitaxial layers 29 serve as a source S and a drain D, respectively, and are formed of a material having a different lattice constant from that of the substrate 21, i.e., silicon substrate. By virtue of a difference in lattice constant between the epitaxial layer 29 and the substrate 21, a strained channel C can be formed in the substrate 21 between the source S and the drain D.

The growth thickness of the epitaxial layer 29 is determined depending on the depth of the recess pattern 28 and device characteristics, and may be in the range of approximately 100 Å to approximately 2,000 Å.

Alternatively, the epitaxial layer 29 may be formed through epitaxial growth, for example, selective epitaxial growth (SEG). At this time, the epitaxial layer 29 includes an epitaxial silicon layer, and the epitaxial silicon layer contains either germanium or carbon or both of germanium and carbon. For example, the epitaxial layer 29 may be formed of one selected from the group consisting of an epitaxial silicon germanium (SiGe) layer, an epitaxial silicon carbon (SiC) layer, and an epitaxial silicon germanium carbon (SiGeC) layer.

The electrical properties of a semiconductor device can be controlled depending on kinds of germanium or carbon contained in the epitaxial layer 29. To be specific, the epitaxial SiGe layer applies a compressive stress to the channel C to increase hole mobility, and thus it may be applicable to a PMOS. The epitaxial SiC layer applies a tensile stress to the channel C to increase electron mobility, and thus it may be applicable to an NMOS.

The amount of stress applied to the channel C can be adjusted depending on the concentration of germanium or carbon contained in the epitaxial layer 29. This is because a difference in lattice constant between the substrate 21 and the epitaxial layer 29 increases as the concentration of germanium or carbon contained in the epitaxial layer 29 increases. As the difference in lattice constant between the substrate 21 and the epitaxial layer 29 increases, the amount of stress applied to the channel C increases so that the strained channel C can be effectively formed. However, the concentration and the layer quality are in a trade-off relationship. That is, as the concentration of germanium or carbon contained in the epitaxial layer 29 increases, the layer quality of the epitaxial layer 29 decreases. Therefore, the concentration of germanium contained in the epitaxial silicon germanium layer may be in the range of approximately 5% to approximately 50%, and the concentration of carbon contained in the epitaxial silicon carbon layer may be in the range of approximately 0.1% to approximately 10%.

Furthermore, the epitaxial layers 29 may include dopant because they serve as the source S and the drain D. The kind of dopant, doping concentration, and doping method can be determined and controlled according to device characteristics. To be specific, a PMOS may use p-type dopant such as boron (B), and an NMOS may use n-type dopant such as phosphor (P) or arsenide (As). The doping concentration may be in the range of approximately $1 \times 10^{16}$ atoms/$cm^3$ to approximately $1 \times 10^{21}$ atoms/$cm^3$. The doping process is performed in-situ during the formation of the epitaxial layer 29, or may be performed using ion implantation after the epitaxial layer 29 grows.

The epitaxial layer 29 may be formed in an apparatus selected from the group consisting of low pressure chemical vapor deposition (LPCVD), very low pressure CVD (VLPCVD), plasma enhanced-CVD (PE-CVD), ultrahigh vacuum CVD (UHVCVD), rapid thermal CVD (RTCVD), atmosphere pressure CVD (APCVD), and molecular beam epitaxy (MBE). The epitaxial layer 29 may grow at a temperature ranging from approximately 400° C. to approximately 800° C.

Through the above-described procedure, the semiconductor device with the strained channel C in accordance with the first embodiment can be fabricated.

As described above, the semiconductor device of the embodiments includes the recess pattern 28 of which the side surface 28A extends below the gate pattern 25, which makes it possible to increase a volume of the epitaxial layer 29 without an increase in a depth of the recess pattern 28. That is, the volume of the epitaxial layer 29 can be increased without increasing the growth thickness of the epitaxial layer 29.

The increase in the volume of the epitaxial layer 29 can effectively induce a strain in the channel C, which can improve electrical properties of the semiconductor device with the strained channel. Furthermore, the concentration of germanium or carbon contained in the epitaxial layer 29 can be reduced by increasing the volume of the epitaxial layer 29. This allows the layer quality of the epitaxial layer 29 to be improved.

In addition, the growth thickness of the epitaxial layer 29 is not increased, so that the defect-free epitaxial layer, i.e., the epitaxial layer 29 with excellent layer quality can be obtained and the productivity of the epitaxial layer 29 can be improved as well.

Consequently, device characteristics can be enhanced by increasing an operation speed and operation current of the semiconductor device with the strained channel, thus improving the yield of semiconductor devices.

Figure 4:
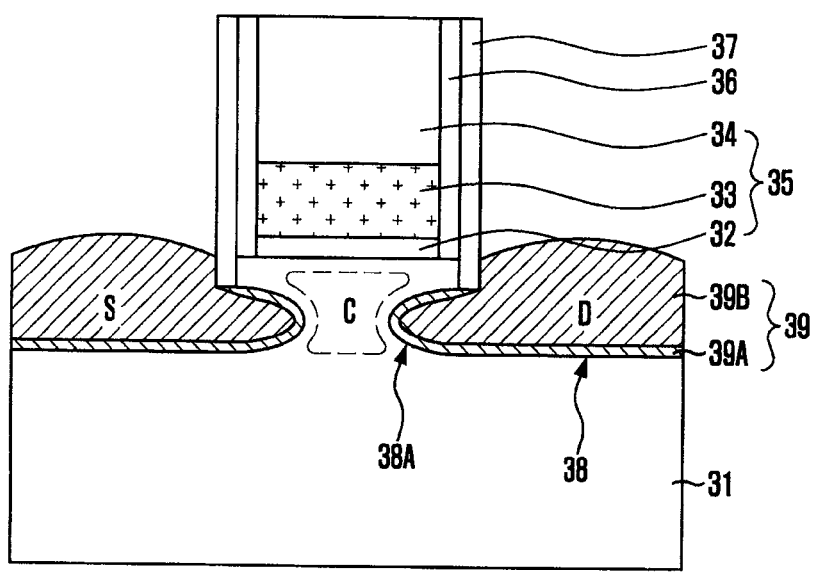
FIG. 4 illustrates a semiconductor device with a strained channel in accordance with another embodiment.

FIG. 4 illustrates a semiconductor device with a strained channel in accordance with another embodiment.

Referring to FIG. 4, the semiconductor device includes a gate pattern 35 disposed on a substrate 31, recess patterns 38, protection layers, a source S, and a drain D. The recess patterns 38 are provided in the substrate 31 at both sides of the gate pattern 35, and each of the recess patterns 38 has a side surface 38A extending below the gate pattern 35. The protection layers are disposed on the surfaces of the recess patterns 38. The source S and the drain D are disposed on the protection layers, and fill the recess patterns 38 so that a strained channel C is disposed under the gate pattern 35. The semiconductor device may further include first gate spacers 36 on both sidewalls of the gate pattern 35, and second gate spacers 37 on the first gate spacers 36. Here, one end of the second gate spacer 37 extends up to the side surface 38A of the recess pattern 38. The substrate 31 may be a silicon substrate.

The protection layer, the source S and the drain D may be a stacked structure formed through an epitaxial growth. To be specific, first epitaxial layers 39A on the surfaces of the recess patterns 38 serve as the protection layers, and second epitaxial layers 39B, which are disposed on the first epitaxial layers 39A and fill the recess patterns 38, serve as the source S and the drain D.

The first epitaxial layer 39A serving as the protection layer may be formed through an epitaxial growth, e.g., SEG, and improves the layer quality of the second epitaxial layer 39B. In more detail, the first epitaxial layer 39A covers surface defects in the recess pattern 38 generated during the formation of the recess pattern 38, and thus prevents the surface defects of the recess pattern 38 from propagating into the second epitaxial layer 39B. Consequently, it is possible to prevent the quality of the second epitaxial layer 39B from being deteriorated. To be specific, the first epitaxial layer 39A covers surface defects in the recess pattern 38 generated during the formation of the recess pattern 38, it can prevent the deterioration of the quality of the second epitaxial layer 39B which may be caused by the propagation of the surface defects in the recess pattern 38 into the second epitaxial layer 39B. To this end, the first epitaxial layer 39A may be formed of a material having the same lattice constant as the silicon substrate. Therefore, the first epitaxial layer 39A may include an epitaxial silicon layer.

The first epitaxial layer 39A inhibits the diffusion of dopant from the second epitaxial layer 39B to maintain a junction depth between the source S and the drain D shallow. For a shallow junction depth, the first epitaxial layer 39A may be formed of undoped material, e.g., undoped epitaxial silicon.

The second epitaxial layer 39B serving as the source S and the drain D may be formed of a material having a different lattice constant from that of the substrate 31, i.e., silicon substrate, and formed through epitaxial growth, e.g., SEG. The second epitaxial layer 39B includes an epitaxial silicon layer. The epitaxial silicon layer may contain at least one of germanium (Ge) and carbon (C). For example, the second epitaxial layer 39B may be one selected from the group consisting of an epitaxial silicon germanium (SiGe) layer, an epitaxial silicon carbon (SiC) layer, and an epitaxial silicon germanium carbon (SiGeC) layer.

The amount of stress applied to the channel C can be adjusted depending on the concentration of germanium or carbon contained in the second epitaxial layer 39B. This is because a difference in lattice constant between the substrate 31 and the second epitaxial layer 39B increases as the concentration of germanium or carbon contained in the second epitaxial layer 39B increases. As the difference in lattice constant between the substrate 31 and the second epitaxial layer 39B increases, the amount of stress applied to the channel C increases so that the strained channel C can be effectively formed. However, the concentration and the layer quality are in a trade-off relationship. That is, as the concentration of germanium or carbon contained in the second epitaxial layer 39B increases, the layer quality of the second epitaxial layer 39B decreases. Therefore, the concentration of germanium contained in the epitaxial silicon germanium layer may be in the range of approximately 5% to approximately 50%, and the concentration of carbon contained in the epitaxial silicon carbon layer may be in the range of approximately 0.1% to approximately 10%.

The electrical properties of a semiconductor device can be controlled depending on what kinds of germanium or carbon are contained in the second epitaxial layer 39B. To be specific, the second epitaxial layer 39B may be formed of an epitaxial SiGe layer in a PMOS. This is because the epitaxial SiGe layer applies a compressive stress to the channel C to increase hole mobility. In contrast, the second epitaxial layer 39B is formed of an epitaxial SiC layer in an NMOS because the epitaxial SiC layer applies tensile stress to the channel C to increase electron mobility.

Furthermore, the second epitaxial layer 39B may include dopant to adjust conductivity because the second epitaxial layer 39B acts as the source S and the drain D. The kind of dopant, doping concentration, and doping method can be determined and controlled according to device characteristics. To be specific, a PMOS may use p-type dopant such as boron (B), and an NMOS may use n-type dopant such as phosphor (P) or arsenide (As). The doping concentration may be in the range of approximately $1 \times 10^{16}$ atoms/cm$^3$ to approximately $1 \times 10^{21}$ atoms/cm$^3$. The doping process is performed in-situ during the formation of the second epitaxial layer 39B, or may be performed using ion implantation after the second epitaxial layer 39B grows.

The gate pattern 35 may include a gate dielectric layer 32, a gate electrode 33, and a gate hard mask layer 34. The gate dielectric layer 32 may include an oxide, e.g., silicon oxide ($SiO_2$) layer. The gate electrode 33 may include one layer selected from the group consisting of a polysilicon layer, a metal layer, a conductive metal nitride layer, a conductive metal oxide layer, and a metal silicide layer, or a multilayer thereof. The metal layer may include tungsten (W), nickel (Ni) or titanium (Ti). The conductive metal nitride layer may include a titanium nitride (TiN) layer. The conductive metal oxide layer may include an iridium oxide ($IrO_2$) layer. The metal silicide layer may include a titanium silicide (TiSi) layer. The gate hard mask layer 34 may include a monolayer selected from the group consisting of an oxide layer, a nitride layer, an oxynitride layer, and an amorphous carbon layer, or a multilayer thereof. The oxide layer may include boron phosphorus silicate glass (BPSG), phosphorus silicate glass (PSG), tetra ethyl ortho silicate (TEOS), undoped silicate glass (USG), spin-on glass (SOG), high-density plasma (HDP), or spin-on dielectric (SOD). The nitride layer may include a silicon nitride ($Si_3N_4$) layer. The oxynitride layer may include a silicon oxynitride (SiON) layer.

As described above, the semiconductor device in accordance with one or more embodiments includes the recess pattern 38 of which the side surface 38A extends below the gate pattern 35, which makes it possible to increase a volume of the second epitaxial layer 39B without an increase in a depth of the recess pattern 38. That is, the volume of the second epitaxial layer 39B can be increased without increasing the growth thickness of the second epitaxial layer 39B.

The increase in the volume of the second epitaxial layer 39B can induce a strain in the channel C effectively, so that the electrical properties of the semiconductor device with the strained channel can be improved. Furthermore, the concentration of germanium or carbon contained in the second epitaxial layer 39B can be reduced by increasing the volume of the second epitaxial layer 39B. This allows the layer quality of the second epitaxial layer 39B to be improved.

In addition, the growth thickness of the second epitaxial layer 39B is not increased, so that a defect-free epitaxial layer, i.e., the second epitaxial layer 39B with excellent layer quality can be obtained and the productivity of the second epitaxial layer 39B can be improved as well.

Moreover, in the semiconductor device in accordance with the another embodiment, the first epitaxial layer 39A is provided, and therefore, it can inhibits the diffusion of dopant from the second epitaxial layer 39B serving as the source S and the drain D to thereby adjust the junction length between the source S and the drain D. Also, it is possible to prevent the deterioration of the quality of the second epitaxial layer 39B that may be caused by residues or surface defects existing on the surface of the recess pattern 38.

Consequently, in accordance with one or more embodiments, device characteristics can be enhanced by increasing an operation speed and operation current of the semiconductor device with the strained channel.

FIGS. 5A to 5E illustrate a method for fabricating the semiconductor device with a strained channel in accordance with the another embodiment.

Figure 5A:
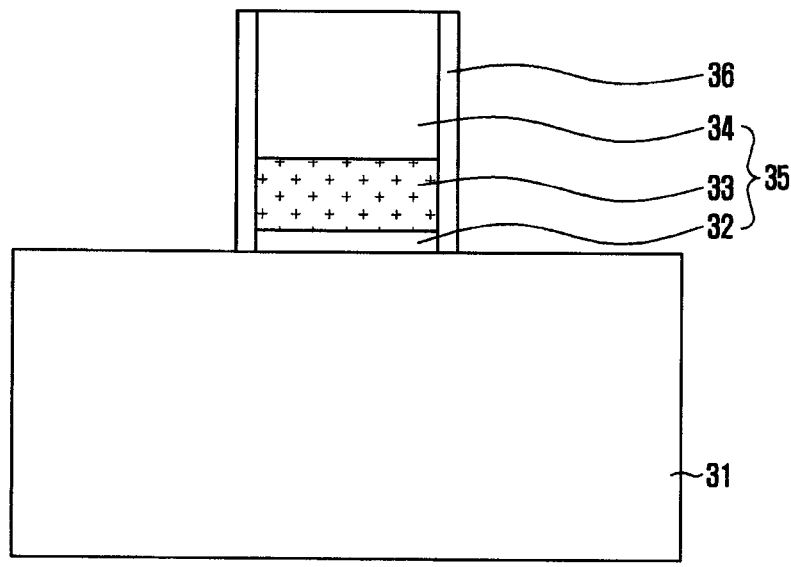
FIGS. 5A to 5E illustrate a method for fabricating the semiconductor device with a strained channel in accordance with the another embodiment.

Referring to FIG. 5A, a gate pattern 35 is formed on a substrate 31. Here, although not shown, a device isolation structure is formed to isolate devices before the formation of the gate pattern 35.

The gate pattern 35 may include a gate dielectric layer 32, a gate electrode 33, and a gate hard mask layer 34. The gate dielectric layer 32 may include an oxide layer, e.g., a silicon oxide ($SiO_2$) layer, and the silicon oxide layer may be formed using a thermal oxidation process. The gate electrode 33 may include a monolayer selected from the group consisting of a polysilicon layer, a metal layer, a conductive metal nitride layer, a conductive metal oxide layer, and a metal silicide layer, or a multilayer thereof. The gate hard mask layer 34 may include a monolayer selected from the group consisting of an oxide layer, a nitride layer, an oxynitride layer, and an amorphous carbon layer, or a multilayer thereof. The substrate 31 may include a silicon substrate.

First gate spacers 36 are formed on both sidewalls of the gate pattern 35. The first gate spacers 36 may include a monolayer or a multilayer of oxide and/or nitride. The oxide layer includes a silicon oxide layer ($SiO_2$), and the nitride layer may include a silicon nitride ($Si_3N_4$) layer.

Here, the first gate spacers 36 may be formed in various ways. For example, a nitride layer is formed over the substrate 31 including the gate pattern 35, and a blanket etch is then performed to form the gate spacers 36. The blanket etch may be performed using an etch-back process.

Figure 5B:
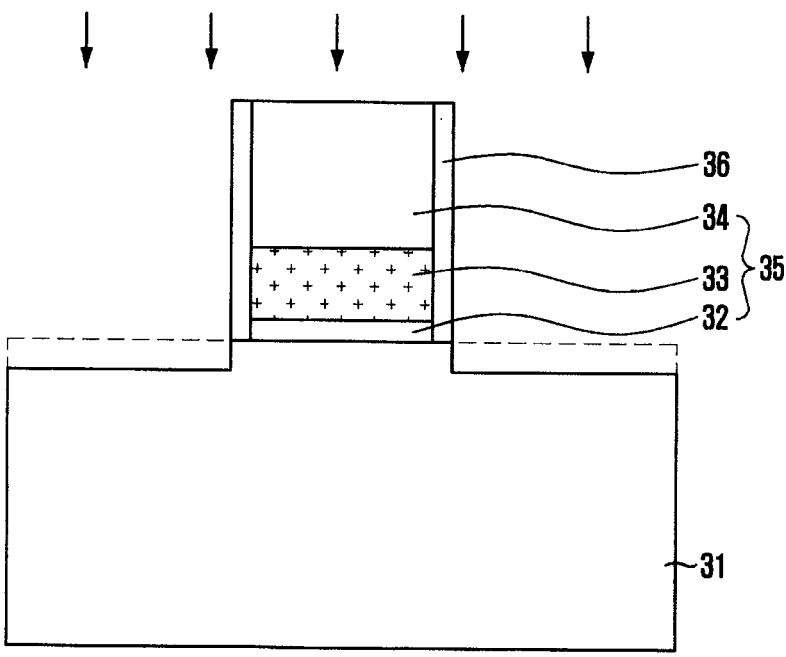

Referring to FIG. 5B, the substrate 31 is etched to a predetermined depth using the gate pattern 35 and the first gate spacers 36 as an etch barrier, which, in this embodiment, is also referred to as a 'primary etch' for simplicity. The primary etch, which is a process of forming a recess pattern of which a side surface extends below the gate pattern 35, may be controlled such that an etch depth is in the range of approximately 20% to approximately 50% with respect to a total depth of a recess pattern to be formed later.

Here, the primary etch may be performed anisotropically. Therefore, the primary etch may be performed using an anisotropic dry etch. The anisotropic dry etch may be performed ex-situ or in-situ. For reference, the meaning of anisotropic dry etch performed ex-situ is that the etching process of forming the first gate spacer 36 and the primary etch are performed in different chambers, respectively, or performed in the same chamber discontinuously. The meaning of anisotropic dry etch performed in-situ is that the etching process of forming the first gate spacer 36 and the primary etch are performed in the same chamber continuously.

To be specific, the primary etch using the anisotropic dry etch may be performed using plasma including a gas containing fluorine (F) and carbon (C) and a gas mixture of oxygen ($O_2$) gas and argon (Ar) gas. The gas containing fluorine (F) and carbon (C) may include fluorocarbon ($C_xF_y$) gas, where x and y are natural numbers, or fluoromethane ($C_xH_yF_z$), where x, y and z are natural numbers. The fluorocarbon gas may include $CF_4$, $C_2F_6$, etc., and the fluoromethane gas may include $CHF_3$, $CH_2F_2$, etc. For example, the primary etch may be performed using a plasma of gas mixture of $CF_4/O_2/Ar$, or a plasma of gas mixture of $CHF_3/O_2/Ar$.

Figure 5C:
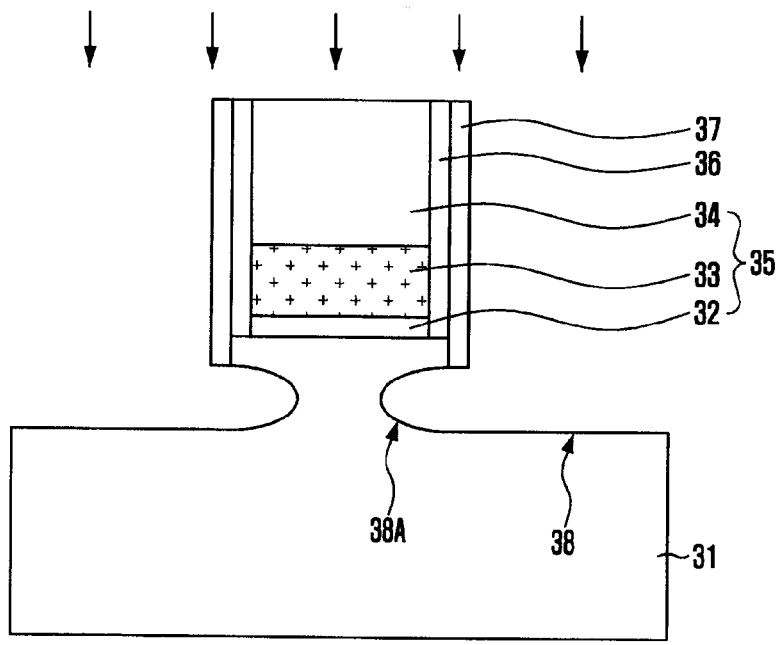

Referring to FIG. 5C, an insulation layer for a gate spacer is formed over the substrate 31 including the first gate spacers 36, and a blanket etch, e.g., etch-back process is then performed to form the second gate spacers 37 on both sidewalls of the gate pattern 35 including the first gate spacers 36. Resultantly, the second gate spacers 37 are formed to cover both sidewalls of the gate pattern 35 and both sidewalls of a portion of the substrate 31 protruding upward during the primary etch.

Here, the second gate spacer 37 may include a monolayer or a multilayer formed of oxide and/or nitride. A thickness of the second gate spacer 37 can be controlled in consideration of a subsequent process of forming a recess pattern.

The substrate 31 is etched using the gate pattern 35 and the second gate spacer 37 as an etch barrier to thereby form recess patterns 38 of which side surfaces 38A extend below the gate pattern 35. Hereinafter, this etching process will also be referred to as a 'secondary etch.' The recess patterns 38 are regions where a source and a drain will be formed.

The secondary etch for forming the recess pattern 38 of which the side surface 38A extends below the gate pattern 35, may be performed such that the substrate 31 is etched to an etch depth ranging from approximately 100 Å to approximately 1,000 Å in a vertical direction, and also etched sufficiently in a horizontal (lateral) direction considering a thickness of the first gate spacer 36, a thickness of the second gate spacer 37, a channel length, and a height of the gate pattern 35.

Furthermore, this secondary etch may be performed isotropically to extend the side surface 38A of the recess pattern 38 below the gate pattern 35. Therefore, the secondary etch may be performed using an isotropic dry etch or isotropic wet etch. The isotropic dry etch may be performed ex-situ or in-situ.

For example, when the secondary etch is performed using the isotropic dry etch, the secondary etch may be performed using a plasma of a gas mixture containing HBr, $Cl_2$, and $SF_6$. As well known, a silicon layer (or silicon substrate) is popularly used for isotropic etch because silicon exhibits excellent reactivity with HBr, $Cl_2$, and $SF_6$. Here, since the secondary etch is an isotropic etch, the substrate 31 is etched only in a vertical direction due to the second gate spacer 37 at an initial etching stage. However, as the secondary etch is further performed to expose the substrate 31 uncovered with the secondary gate spacer 37, the substrate 31 begins to be etched in a horizontal direction. Resultantly, it is possible to form the recess pattern 38 having the side surface 38A of which an etch profile has the shape of '⊂' or '<', as illustrated in FIG. 5C.

Meanwhile, etch by-products may be produced during the secondary etch, and remain on the surface of the recess pattern 38. If the etch by-products remain on the surface of the recess pattern 38, a defect may be generated in an epitaxial layer due to the remaining etch by-products during a subsequent epitaxial growth, or the adhesion between the epitaxial layer and the substrate 31 reduces so that the epitaxial layer may not grow well.

When the secondary etch is performed using plasma, the surface of the recess pattern 38 may be damaged by plasma, causing a defect to be generated on the surface of the recess pattern 38. The defects on the surface of the recess pattern 38 propagate into the epitaxial layer during an epitaxial growth to be performed later, which may lead to a decrease in layer quality of an epitaxial layer.

Figure 5D:
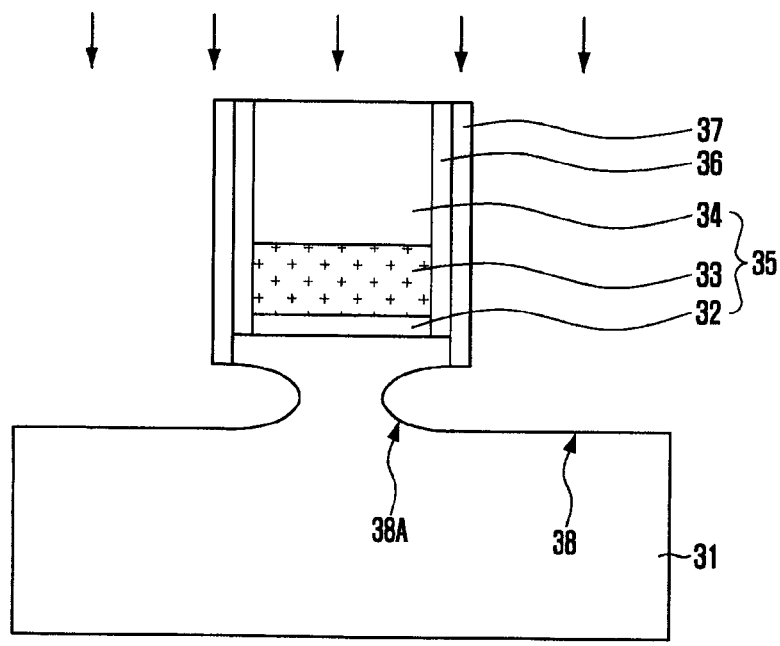

Therefore, referring to FIG. 5D, a cleaning treatment is performed on the surface of the recess pattern 38 to remove residues, e.g., etch by-products remaining on the surface of the recess pattern 38, and also to cure surface damage of the recess pattern 38. The cleaning treatment may be performed using either of wet cleaning or dry cleaning or both of wet cleaning and dry cleaning. To be specific, the dry cleaning may be performed using a gas mixture of $CF_4$ and $O_2$, and the wet cleaning may be performed using a mixed solution of sulfuric acid ($H_2SO_4$) and hydrogen peroxide ($H_2O_2$) or using a buffered oxide etchant (BOE) which is a mixed solution of $NH_4F$ and HF.

Also, the cleaning treatment may be performed in-situ in an apparatus of forming an epitaxial layer. The cleaning treatment may be performed using a gas or solution having good etch selectivity allowing damage to the first and second gate spacers 36 and 37 to be minimized. Furthermore, the cleaning treatment may be performed at a relatively low temperature, e.g., in the range of room temperature to approximately 600° C.

In this way, it is possible to prevent a defect from being generated in an epitaxial layer to be formed later, by removing residues, such as a natural oxide and an etch by-product remaining on the surface of the recess pattern, and simultaneously curing the surface damage of the recess pattern through the cleaning treatment.

Meanwhile, the cleaning treatment can effectively remove the residues remaining on the surface of the recess pattern 38 because the cleaning treatment is based on the chemical reaction of cleaning gases or cleaning solutions. However, there is a limitation to the removal of surface defects, for example, a physical defect such as lattice unconformity of the recess pattern 38 caused by plasma.

Figure 5E:
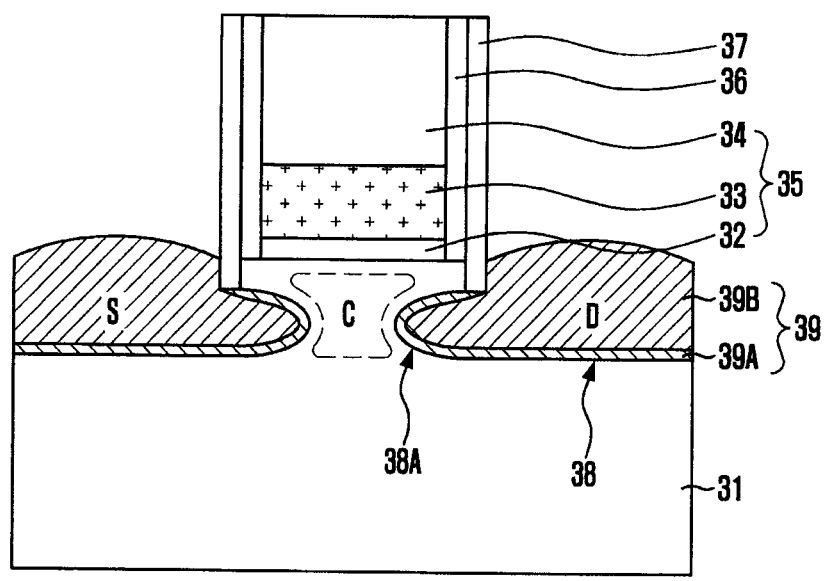

Therefore, referring to FIG. 5E, a first epitaxial layer 39A serving as a protection layer is formed on the recess pattern 38 to cure the physical defect on the surface of the recess pattern 38 that remains after the cleaning treatment. The first epitaxial layer 39A may be formed through SEG. The first epitaxial layer 39A may be formed of a material having the same lattice constant as the substrate 31, e.g., silicon substrate, to effectively cure physical defects, such as a lattice nonconformity, on the surface of the recess pattern. That is, the first epitaxial layer 39A may be formed of epitaxial silicon.

The first epitaxial layer 39A inhibits the diffusion of dopant from a second epitaxial layer 39B to maintain a junction depth between the source S and the drain D shallow. Therefore, the first epitaxial layer 39A may be formed of undoped epitaxial silicon.

The second epitaxial layer 39B is formed on the recess pattern 38 using an epitaxial growing apparatus, and fills the recess pattern 38. The second epitaxial layer 39B serves as a source S and a drain D, and is formed of a material having a different lattice constant from that of the substrate 31, i.e., silicon substrate. In virtue of a difference in lattice constant between the second epitaxial layer 39B and the substrate 31, a strained channel C can be formed in the substrate 31 between the source S and the drain D.

The growth thickness of the epitaxial layer 39 is determined depending on the depth of the recess pattern and device characteristics, and may be in the range of approximately 100 Å to approximately 2,000 Å.

Alternatively, the second epitaxial layer 39B may be formed through epitaxial growth, for example, selective epitaxial growth (SEG). The second epitaxial layer 39B and the first epitaxial layer 39A may be formed in-situ. At this time, the second epitaxial layer 39B includes an epitaxial silicon layer, and the epitaxial silicon layer contains either germanium or carbon or both of germanium and carbon. For example, the second epitaxial layer 39B may be formed of one selected from the group consisting of an epitaxial silicon germanium (SiGe) layer, an epitaxial silicon carbon (SiC) layer, and an epitaxial silicon germanium carbon (SiGeC) layer.

The electrical properties of a semiconductor device can be controlled depending on kinds of germanium or carbon contained in the second epitaxial layer 39B. Therefore, the second epitaxial layer 39B in a PMOS may be an epitaxial silicon germanium layer because the epitaxial silicon germanium layer applies a compressive stress to the channel to increase hole mobility. Likewise, the second epitaxial layer 39B in an NMOS may be an epitaxial silicon carbon layer because the epitaxial silicon carbon layer applies a tensile stress to the channel to increase electron mobility.

The amount of stress applied to the channel C can be adjusted depending on the concentration of germanium or carbon contained in the second epitaxial layer 39B. This is because a difference in lattice constant between the substrate 31 and the second epitaxial layer 39B increases as the concentration of germanium or carbon contained in the second epitaxial layer 39B increases. As the difference in lattice constant between the substrate 31 and the second epitaxial layer 39B increases, the amount of stress applied to the channel C also increases so that the strained channel C can be effectively formed. However, the concentration and the layer quality are in a trade-off relationship. That is, as the concentration of germanium or carbon contained in the second epitaxial layer 39B increases, the layer quality of the second epitaxial layer 39B decreases. Therefore, the concentration of germanium contained in the epitaxial silicon germanium layer may be in the range of approximately 5% to approximately 50%, and the concentration of carbon contained in the epitaxial silicon carbon layer may be in the range of approximately 0.1% to approximately 10%.

Furthermore, the second epitaxial layers 39B may include dopant because they serve as the source S and the drain D. The kind of dopant, doping concentration, and doping method can be determined and controlled according to device characteristics. To be specific, a PMOS may use p-type dopant such as boron (B), and an NMOS may use n-type dopant such as phosphor (P) or arsenide (As). The doping concentration may be in the range of approximately $1 \times 10^{16}$ atoms/cm$^3$ to approximately $1 \times 10^{21}$ atoms/cm$^3$. The doping process is performed in-situ during the formation of the second epitaxial layer 39B, or may be performed using ion implantation after the second epitaxial layer 39B grows.

The second epitaxial layer 39B may be formed in an apparatus selected from the group consisting of low pressure chemical vapor deposition (LPCVD), very low pressure CVD (VLPCVD), plasma enhanced-CVD (PE-CVD), ultrahigh vacuum CVD (UHVCVD), rapid thermal CVD (RTCVD), atmosphere pressure CVD (APCVD) and molecular beam epitaxy (MBE). The second epitaxial layer 39B may grow at a temperature ranging from approximately 400° C. to approximately 800° C.

Through the above-described procedure, the semiconductor device with the strained channel C in accordance with the another embodiment can be fabricated.

As described above, the semiconductor device in accordance with one or more embodiments includes the recess pattern 38 of which the side surface 38A extends below the gate pattern 35, which makes it possible to increase a volume of the second epitaxial layer 39B without an increase in a depth of the recess pattern 38. That is, the volume of the second epitaxial layer 39B can be increased without increasing the growth thickness of the second epitaxial layer 39B.

The increase in the volume of the second epitaxial layer 39B can induce a strain in the channel C effectively, thereby improving electrical properties of the semiconductor device with the strained channel. Furthermore, the concentration of germanium or carbon contained in the second epitaxial layer 39B can be reduced by increasing the volume of the second epitaxial layer 39B. This allows the layer quality of the second epitaxial layer 39B to improve.

In addition, the growth thickness of the second epitaxial layer 39B is not increased so that the defect-free epitaxial layer, i.e., the second epitaxial layer 39B with excellent layer quality can be obtained and the productivity of the second epitaxial layer 39B can be improved as well.

Moreover, in the semiconductor device in accordance with the another embodiment, the first epitaxial layer 39A is provided, and therefore, it can inhibit the diffusion of dopant from the second epitaxial layer 39B serving as the source S and the drain D to thereby adjust the junction length between the source S and the drain D. Also, it is possible to prevent the deterioration of the quality of the second epitaxial layer 39B that may be caused by residues or surface defects existing on the surface of the recess pattern 38.

Consequently, in accordance with one or more embodiments, device characteristics can be enhanced by increasing an operation speed and operation current of the semiconductor device with the strained channel, thus improving the yield of semiconductor devices.

In accordance with the foregoing embodiments, the semiconductor device includes the recess pattern of which the side surface extends below the gate pattern, which makes it possible to increase a volume of the epitaxial layer without an increase in a depth of the recess pattern. That is, the volume of the epitaxial layer can be increased without increasing the growth thickness of the epitaxial layer.

The increase in the volume of the epitaxial layer can effectively induce a strain in the channel, thus improving electrical properties of the semiconductor device with the strained channel. Furthermore, the concentration of germanium or carbon contained in the epitaxial layer can be reduced by increasing the volume of the epitaxial layer. This allows the layer quality of the epitaxial layer to improve.

In addition, the growth thickness of the epitaxial layer is not increased, so that a defect-free epitaxial layer, i.e., the epitaxial layer with excellent layer quality can be obtained and the productivity of the epitaxial layer can be improved as well.

Moreover, when the protection layer is further provided, it can inhibits the diffusion of dopant from the second epitaxial layer serving as the source and the drain to thereby adjust the junction length between the source and the drain. Furthermore, it is possible to prevent the quality of the second epitaxial layer due to residues or surface defects existing on the surface of the recess pattern.

Consequently, in accordance with one or more embodiments, device characteristics can be improved by increasing an operation speed and operation current of the semiconductor device with the strained channel. This can also improve the yield of semiconductor devices.

While the various embodiments have been described, it will be apparent to those skilled in the art that various changes and modifications may be made.

What is claimed is:

1. A method for fabricating a semiconductor device, the method comprising:
   forming a gate pattern over a substrate;
   etching the substrate at both sides of the gate pattern to form recess patterns each having a side surface extending below the gate pattern;
   forming a source and a drain by respectively filling the recess patterns using epitaxial growth; and
   forming a protection layer over a surface of the recess pattern through an epitaxial growth before forming the source and the drain,
   wherein the protection layer comprises a material having a lattice constant equal to that of the substrate.

2. The method of claim 1, wherein forming the recess patterns comprises:
   forming first gate spacers over both sidewalls of the gate pattern;
   performing a primary etch on the substrate to a predetermined etch depth using the gate pattern and the first gate spacers as an etch barrier through an anisotropic etch;
   forming second gate spacers over both of the sidewalls of the gate pattern and sidewalls of the substrate exposed by the primary etch; and performing a secondary etch on the substrate using the gate pattern and the second gate spacer as an etch barrier through an isotropic etch.

3. The method of claim 2, wherein the predetermined etch depth of the primary etch is in a range of approximately 20% to approximately 50% with respect to a total depth of the recess pattern.

4. The method of claim 1, wherein the source and the drain comprise an epitaxial layer growing through selective epitaxial growth (SEG).

5. The method of claim 1, wherein the source and the drain comprise one selected from the group consisting of an epitaxial silicon germanium (SiGe) layer, an epitaxial silicon carbon (SiC) layer, and an epitaxial silicon germanium carbon (SiGeC) layer.

6. The method of claim 5, wherein a concentration of germanium in the epitaxial silicon germanium layer is in a range of approximately 5% to approximately 50%.

7. The method of claim 5, wherein a concentration of carbon in the epitaxial silicon carbon layer is in a range of approximately 0.1% to approximately 10%.

8. The method of claim 1, wherein the source and the drain comprise an epitaxial layer doped with p-type or n-type dopant.

9. The method of claim 1, wherein the protection layer comprises an epitaxial layer formed through selective epitaxial growth (SEG).

10. The method of claim 1, wherein the protection layer comprises an epitaxial silicon layer.

11. The method of claim 1, wherein the source and drain, and the protection layer are formed in-situ.

12. The method of claim 1, wherein the substrate comprises a silicon substrate, and the source and the drain comprise a material having a lattice constant differing from that of the substrate.

13. The method of claim 1, wherein the material of the protection layer is an undoped material.

\* \* \* \* \*